United States Patent
Sakurai

(10) Patent No.: US 10,868,368 B2
(45) Date of Patent: Dec. 15, 2020

(54) ANTENNA SUBSTRATE

(71) Applicant: KYOCERA Corporation, Kyoto (JP)

(72) Inventor: Keizou Sakurai, Yasu (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 16/468,711

(22) PCT Filed: Dec. 8, 2017

(86) PCT No.: PCT/JP2017/044148
§ 371 (c)(1),
(2) Date: Jun. 12, 2019

(87) PCT Pub. No.: WO2018/116867
PCT Pub. Date: Jun. 28, 2018

(65) Prior Publication Data
US 2019/0319350 A1  Oct. 17, 2019

(30) Foreign Application Priority Data

Dec. 22, 2016 (JP) ................................. 2016-248789

(51) Int. Cl.
*H01Q 21/06* (2006.01)
*H01Q 1/22* (2006.01)
*H01Q 9/04* (2006.01)

(52) U.S. Cl.
CPC ......... *H01Q 21/065* (2013.01); *H01Q 1/2283* (2013.01); *H01Q 9/0414* (2013.01)

(58) Field of Classification Search
CPC .. H01Q 9/0414; H01Q 9/0421; H01Q 9/0457; H01Q 1/38; H01Q 1/2283; H01Q 21/06; H01Q 21/061; H01Q 21/065
See application file for complete search history.

(56) References Cited

U.S. PATENT DOCUMENTS

2014/0266947 A1* 9/2014 Chen .................... H01Q 1/2283
                                                                343/772
2014/0268587 A1* 9/2014 Nomura ................. H05K 3/284
                                                                361/728

(Continued)

FOREIGN PATENT DOCUMENTS

| CN | 105472863 A | 4/2016 |
|----|-------------|--------|
| JP | 2000-138525 A | 5/2000 |
| JP | 2004-327641 A | 11/2004 |

*Primary Examiner* — Daniel Munoz
(74) *Attorney, Agent, or Firm* — Volpe Koenig

(57) ABSTRACT

An antenna substrate includes a cap substrate including first antenna conductors arranged lengthwise and crosswise on a first insulating layer facing each other, and a first connection pad on the outer peripheral edge of the first insulating layer's lower surface; a frame substrate including a second connection pad on an outer peripheral edge of a second insulating layer's upper surface and a third connection pad on an outer peripheral edge of the second insulating layer's lower surface; and a base substrate including a plurality of second antenna conductors arranged on a third insulating layer's upper surface and a fourth connection pad on an outer peripheral edge of the third insulating layer's upper surface. The base, frame and cap substrates are layered in this order. First opening portions in the second insulating layer have an outer periphery located radially outward from the first antenna conductor's outer periphery in a top view.

8 Claims, 3 Drawing Sheets

(56) References Cited

U.S. PATENT DOCUMENTS

| | | | |
|---|---|---|---|
| 2016/0049723 A1 | 2/2016 | Baks et al. | |
| 2016/0095218 A1* | 3/2016 | Sakurai | H05K 1/0218 |
| | | | 361/768 |
| 2019/0312331 A1* | 10/2019 | Sakurai | H01Q 21/06 |
| 2019/0334231 A1* | 10/2019 | Sakurai | H05K 3/28 |
| 2020/0161766 A1* | 5/2020 | Liu | H01L 23/66 |

* cited by examiner

US 10,868,368 B2

ANTENNA SUBSTRATE

TECHNICAL FIELD

The present disclosure relates to an antenna substrate.

BACKGROUND ART

Recently, antenna substrates have been developed for transmitting and receiving electromagnetic waves for signal. The antenna substrate is used for wireless communication between electronic devices or for obstacle detection devices for automobile or the like. Patent Document 1 states that an antenna substrate is provided with a spacer and two mounting substrates, where the mounting substrates are each disposed above and below the spacer.

CITATION LIST

Patent Document

Patent Document 1: JP 2004-327641A

SUMMARY OF INVENTION

An antenna substrate of the present disclosure includes a cap substrate, a frame substrate, and a base substrate. The cap substrate includes a first insulating layer, a plurality of first antenna conductors arranged lengthwise and crosswise on both upper and lower surfaces of the first insulating layer and aligned to face each other with a first insulating layer interposed in between, and a first connection pad disposed on the outer peripheral edge of the lower surface of the first insulating layer. The frame substrate includes a second insulating layer, a second connection pad disposed on the outer peripheral edge of an upper surface of the second insulating layer, and a third connection pad disposed on the outer peripheral edge of a lower surface of the second insulating layer. The base substrate includes a third insulating layer, a plurality of second antenna conductors arranged on the upper surface of the third insulating layer, and a fourth connection pad disposed on the outer peripheral edge of the upper surface of the third insulating layer. The first connection pad and the second connection pad are connected to each other, and the third connection pad and the fourth connection pad are connected to each other, and the base substrate, the frame substrate, and the cap substrate are layered in this order. The second insulating layer includes a first opening portion having an outer periphery located radially outward from an outer periphery of the first antenna conductor in a top view. The first opening portion is disposed to encircle the outer periphery of the first antenna conductor.

DESCRIPTION OF EMBODIMENT

Figure 1A:
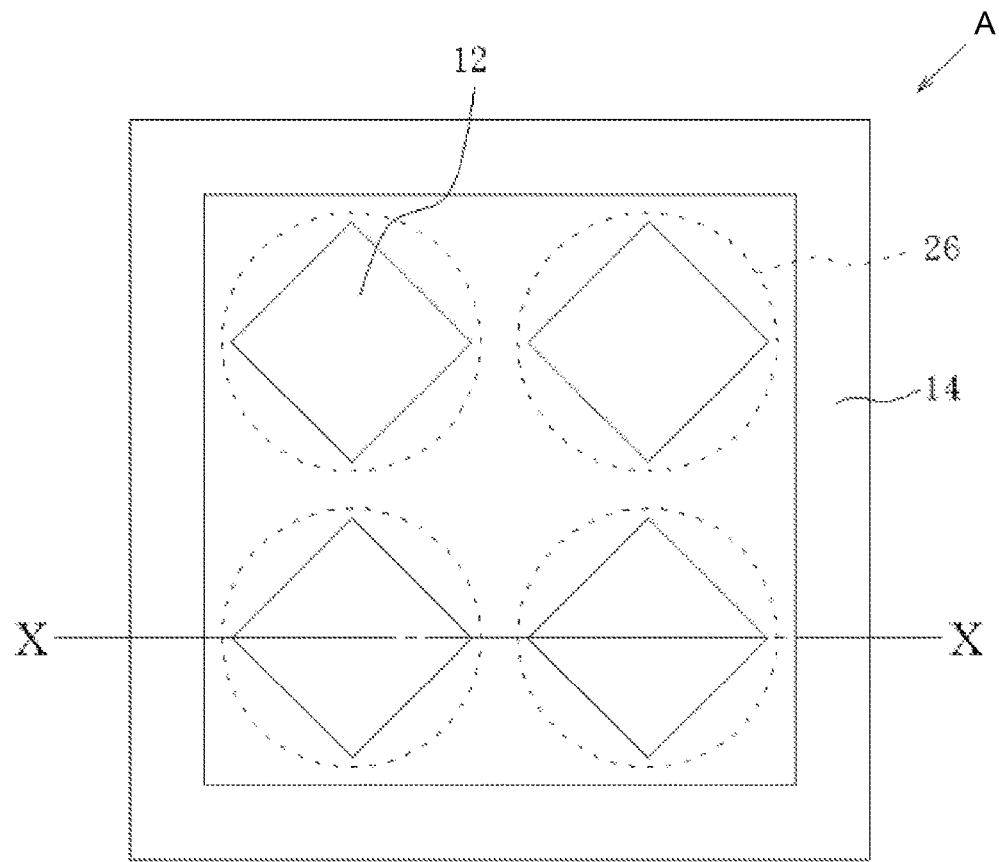
FIG. 1A is a top view schematically illustrating a first embodiment example of an antenna substrate of the present disclosure.
Figure 1B:
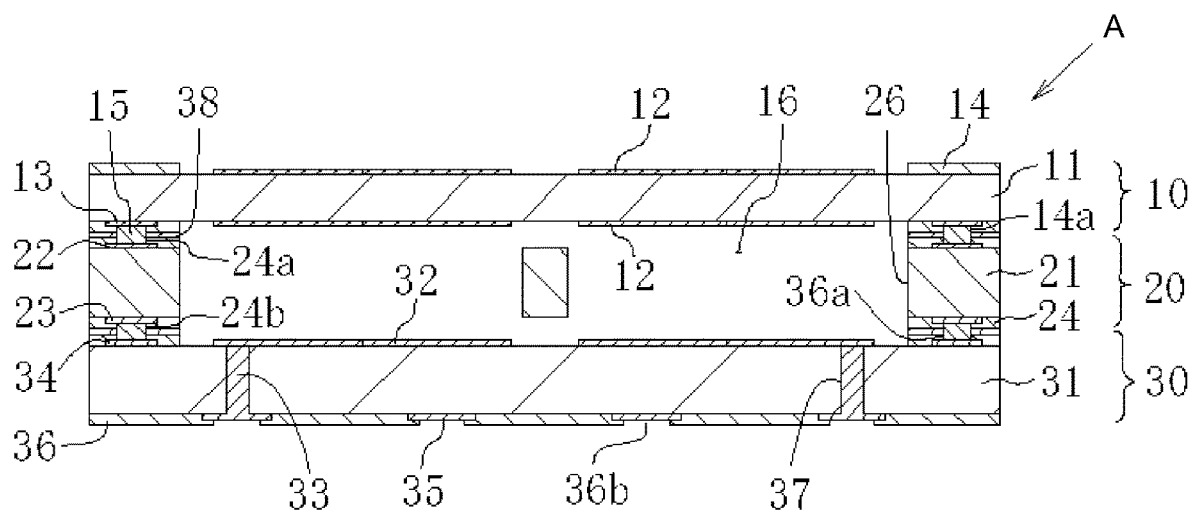
FIG. 1B is a cross-sectional view cut along X-X illustrated in FIG. 1A.

One example of embodiments of an antenna substrate A of the present disclosure will be described based on FIGS. 1A and 1B. FIG. 1A is a top view illustrating an embodiment example of an antenna substrate A of the present disclosure. FIG. 1B is a cross-sectional view cut along X-X illustrated in FIG. 1A.

The antenna substrate A includes a cap substrate 10, a frame substrate 20, and a base substrate 30. The antenna substrate A includes a layered body (no reference sign assigned) layered from the top in order of the cap substrate 10, the frame substrate 20, and the base substrate 30. The layered body ensures the mechanical strength of the antenna substrate A.

The cap substrate 10 includes a first insulating layer 11, a first antenna conductor 12, a first connection pad 13, and a solder-resist layer 14.

A plurality of first antenna conductors 12 are arranged at the center portions of the upper and lower surfaces of the first insulating layer 11. The first antenna conductors 12 are arranged lengthwise and crosswise and aligned to face each other with the first insulating layer 11 interposed in between. That is, a plurality of first antenna conductors 12 are arranged to overlap each other on the upper and lower surfaces of the first insulating layer 11 in a top view. In this example, a first antenna conductor included among the plurality of first antenna conductors 12 on the upper surface of the first insulating layer 11 and a first antenna conductor included among the plurality of first antenna conductors 12 on the lower surface of the first insulating layer 11, which mutually face each other with the first insulating layer 11 interposed in between, have an identical shape and dimensions.

A plurality of first connection pads 13 are arranged on the outer peripheral edge of the lower surface of the first insulating layer 11. The solder-resist layers 14 are further disposed on the outer peripheral edges of the upper and lower surfaces of the first insulating layer 11. The first connection pad 13 is exposed into an opening portion 14a provided through the solder-resist layer 14.

The frame substrate 20 includes a second insulating layer 21, a second connection pad 22, a third connection pad 23, and a solder-resist layer 24.

The second insulating layer 21 includes a first opening portion 26 having an outer periphery located radially outward from the outer periphery of the first antenna conductor 12 in a top view. That is, a plurality of first opening portions 26 are provided through the second insulating layer 21. Each of the plurality of first opening portions 26 is disposed to allow the first antenna conductor 12 to be accommodated thereinside when viewed from the top (in the top face perspective view). The first opening portion 26 forms a cavity 16 when clamped between the cap substrate 10 and the base substrate 30. A cavity 16 functions as a path for transmitting and receiving electromagnetic waves for signal between the first antenna conductor 12 and a second antenna conductor 32. A spacing between the first antenna conductor 12 and the second antenna conductor 32 can be regulated to an optimal dimension for the transmission and reception of electromagnetic waves for signal by adjusting of the thickness of the second insulating layer 21.

A plurality of second connection pads 22 are arranged on the outer peripheral edge of the upper surface of the second insulating layer 21. A plurality of third connection pads 23 are arranged on the outer peripheral edge of the lower surface of the second insulating layer 21. The solder-resist layers 24 are further disposed on the outer peripheral edges of the upper and lower surfaces of the second insulating layer 21. The second connection pad 22 is exposed to an opening portion 24a provided through the solder-resist layer 24. The third connection pad 23 is exposed to an opening portion 24b provided through the solder-resist layer 24. The second connection pad 22 is connected to the first connection pad 13 via solder 15. The first connection pad 13 and the second connection pad 22 allow the cap substrate 10 to be physically as well as electrically connected to the frame substrate 20. This allows the cap substrate 10 to be overlaid on the frame substrate 20.

The base substrate 30 includes a third insulating layer 31, the second antenna conductor 32, a conductor layer 33, a fourth connection pad 34, an electrode 35, and a solder-resist layer 36.

A plurality of second antenna conductors 32 are arranged on the upper surface of the third insulating layer 31. The second antenna conductor 32 is disposed at a position facing the first antenna conductor 12. As described above, the first opening portion 26 is provided in correspondence with the first antenna conductor 12. Accordingly, in the cavity 16, the second antenna conductors 32 directly face the respective first antenna conductor 12 and the spacing (such as air within the cavity 16) is interposed in between. The third insulating layer 31 includes a plurality of through holes 37 that vertically pass therethrough.

The conductor layer 33 is disposed on a surface of the third insulating layer 31 and on the inner side of the through hole 37. A part of the conductor layer 33 is connected to the second antenna conductor 32.

A plurality of fourth connection pads 34 are arranged on the outer peripheral edge of the upper surface of the third insulating layer 31. The fourth connection pad 34 is connected to the third connection pad 23 via the solder 15. Thus, the frame substrate 20 is overlaid on the base substrate 30. The third connection pad 23 and the fourth connection pad 34 allow the frame substrate 20 to be physically as well as electrically connected to the base substrate 30.

A plurality of electrodes 35 are arranged on the lower surface of the third insulating layer 31. The electrode 35 is connected to an electrode of an external electric circuit board via solder. This allows the antenna substrate A to be electrically connected to the external electric circuit board.

The solder-resist layer 36 is disposed on portions of the upper and lower surfaces of the third insulating layer 31. The solder-resist layer 36 includes an opening portion 36a through which the fourth connection pad 34 is exposed. The solder-resist layer 36 includes an opening portion 36b through which the electrode 35 is exposed.

As described above, the antenna substrate A is configured such that the frame substrate 20 and the cap substrate 10 are sequentially layered over the base substrate 30.

The antenna substrate A has the following functions, for example.

First, a signal sent from the external electric circuit board is transmitted to the second antenna conductor 32 via the electrode 35 and the conductor layer 33.

Next, the second antenna conductor 32 that has received the signal radiates an electromagnetic wave.

Next, the radiated electromagnetic wave propagates within the cavity 16, and then propagates sequentially to the first antenna conductor 12 on the lower surface side and then the first antenna conductor 12 on the upper surface side of the first insulating layer 11.

Then, the first antenna conductor 12 on the upper surface side radiates the electromagnetic wave outward. Alternatively, the first antenna conductor 12 has a function of sending, as a signal, an electromagnetic wave received from outside to the external electric circuit board via the path described above in the opposite direction.

Thus, in the antenna substrate A, the outer periphery of the first opening portion 26 that forms the cavity 16 needs to be disposed to be located radially outward from the outer periphery of the first antenna conductor 12 to ensure a path for the transmission and/or reception of electromagnetic waves. In the antenna substrate A, the spacing between the first antenna conductor 12 and the second antenna conductor 32 is maintained constant, thereby enabling stable transmission and reception of electromagnetic waves between the two components.

A sealing resin 38 fills the gap in the connection portions of the cap substrate 10 and the frame substrate 20; and the gap in the connection portions of the frame substrate 20 and the base substrate 30. The sealing resin 38 firmly joins the cap substrate 10, the frame substrate 20, and the base substrate 30 together. The sealing resin 38 further suppresses entry of moisture, foreign material, and the like through the gap into the cavity 16. Thus, the second antenna conductor 32 in the cavity 16 can be protected from the external environment.

The first to third insulating layers 11, 21, and 31 are composed of an electric insulating material that may be produced by thermally curing a glass cloth impregnated with a thermosetting resin such as an epoxy resin or bismaleimide triazine resin to a flat shape under heat and pressure.

The first opening portion 26 is formed, for example, by drilling process. Processing the first opening portion 26 into a circular shape by drilling process can enhance the positional accuracy or the processing speed.

The through hole 37 is formed, for example, by drilling process, laser machining process, or blasting process.

The first and second antenna conductors 12 and 32, the first to fourth connection pads 13, 22, 23, and 34, and the conductor layer 33 are composed of a good electrically conductive metal, such as copper plating, using a publicly known plating technique, for example.

The solder-resist layer 14, 24, and 36 are composed of an electric insulating material that is prepared by, for example, applying a thermosetting resin having photosensitive properties, such as an acryl-modified epoxy resin, to the insulating layer surface, and then forming the resin into a predetermined pattern by exposure and development.

The connection of the cap substrate 10, the frame substrate 20, and the base substrate 30 may be established as follows, for example.

First, the solder 15 is welded to at least one of the first connection pad 13 and the second connection pad 22; and at least one of the third connection pad 23 and the fourth connection pad 34.

Next, the frame substrate 20 is placed on the base substrate 30 and the cap substrate 10 is placed on the frame substrate 20, with the first connection pad 13 and the second connection pad 22 facing each other and with the third connection pad 23 and the fourth connection pad 34 facing each other.

Next, the solder 15 is melt using a reflow process and is then cooled and fixed thereon. This allows the cap substrate 10, the frame substrate 20, and the base substrate 30 to be connected together via the solder 15.

Lastly, the sealing resin 38 having thermosetting properties, for example, is filled in the gap between the connection portions of the cap substrate 10 and the frame substrate 20; and the gap between the connection portions of the frame substrate 20 and the base substrate 30 and then thermally cured. Thus, the cap substrate 10, the frame substrate 20, and the base substrate 30 are firmly joined together.

As described above, the antenna substrate A of the present example includes the second insulating layer 21 including the first opening portion 26, which has, for example, a circular shape, having the outer periphery located radially outward from the outer periphery of the first antenna conductor 12 in a top view. Thus, even in the antenna substrate (for example, the antenna substrate A in the embodiment) in which opening portions such as the first opening portion 26 need to be arranged densely, the number of portions where the spacing between the respective adjacent first opening portions 26 becomes narrow is less than the number in an antenna substrate in a related art. In this case, a portion of the first insulating layer 11 around the first opening portion 26, which encircles the individual first antenna conductor 12, has a function of enhancing the mechanical strength of the antenna substrate A. This reduces the deformation of the antenna substrate A even in a case where the cavities 16 are arranged densely. As a result, the spacing between the first antenna conductor 12 and the second antenna conductor 32 is maintained constant. This makes it possible to provide the antenna substrate A having a high functionality and compact size. In the present disclosure, the description above is particularly effective in a case where the respective first antenna conductors 12 adjacent to each other are arranged such that the respective corner portions face each other as illustrated in FIG. 1A.

That is, according to the antenna substrate A of the present disclosure, the second insulating layer 21 includes the first opening portion 26 having the outer periphery located radially outward from the outer periphery of the first antenna conductor 12 in a top view. Then, the first opening portion 26 is disposed to individually encircle the outer periphery of the first antenna conductor 12. Thus, the number of portions where the spacing between the respective adjacent first opening portions 26 becomes narrow is reduced compared to an interconnection substrate in a related art. Thus, the rigidity of the frame substrate 20 may be maintained, the deformation of the antenna substrate A may be reduced, and the cavities 16 can be densely arranged. As a result, the deformation of the cavity 16 can be prevented and the spacing between the first antenna conductor 12 and the second antenna conductor 32 is maintained constant, and thus the antenna substrate A having a high functionality and compact size being capable of good transmission and reception of electric wave signal can be provided.

Figure 2:
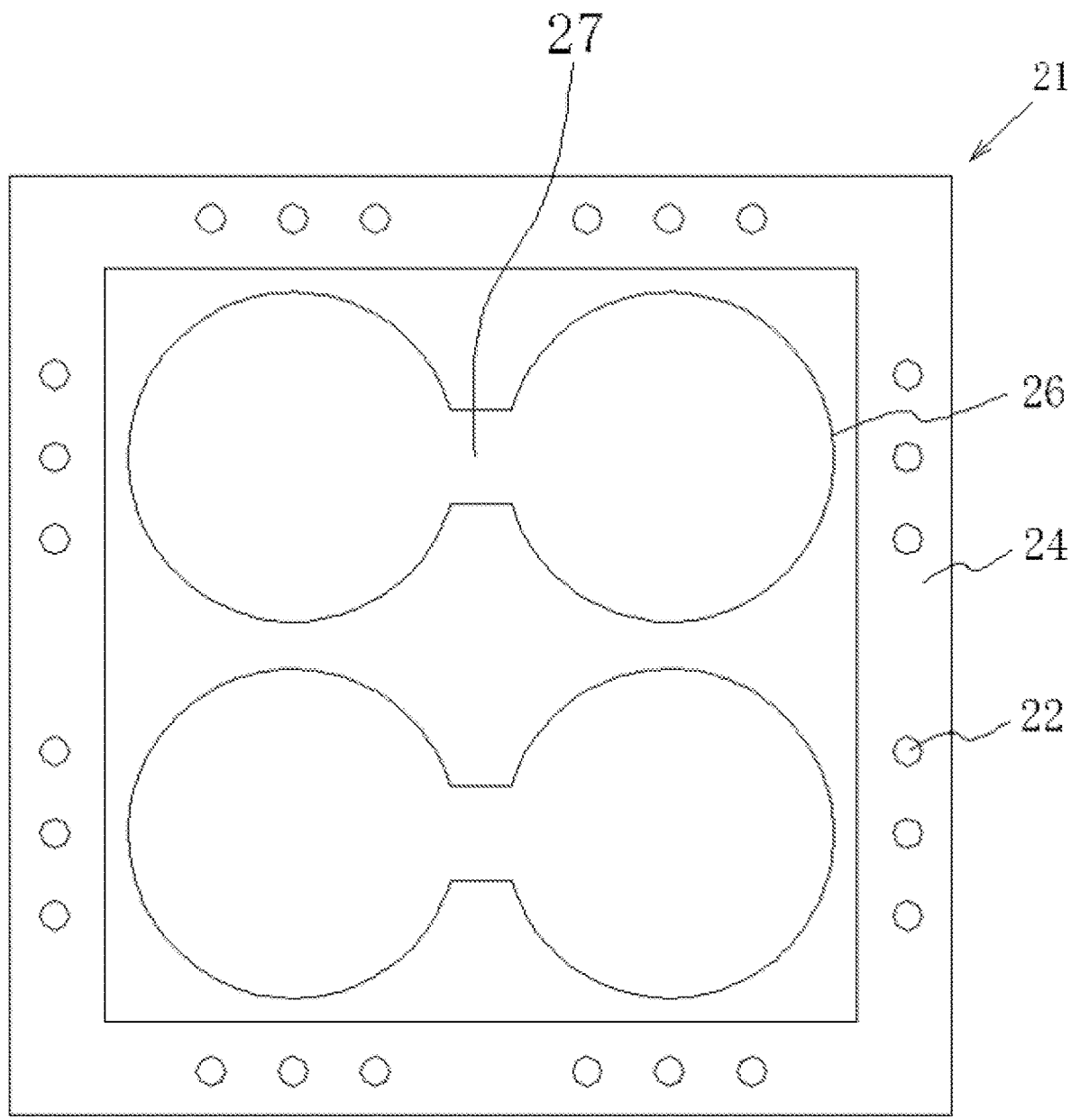
FIG. 2 is a top view schematically illustrating a second embodiment example of an antenna substrate of the present disclosure.

The disclosure is not limited to one example of the above-described embodiments, and various modifications or improvements are applicable within the scope of claims. For example, as illustrated in FIG. 2, the second insulating layer 21 may include a communicating portion 27 that allows the respective first opening portions 26 to communicate with each other. The communicating portion 27 passes through the second insulating layer 21 in the thickness direction. The communicating portion 27 may contribute to, for example, the enhancement of the processability of the first opening portion 26. The outer diameter of the communicating portion 27 (the width of the communicating portion 27 in a direction that is orthogonal to the direction in which the communicating portion 27 extends) is less than the outer diameter or inner diameter of the first opening portion 26 in the same direction.

Figure 3:
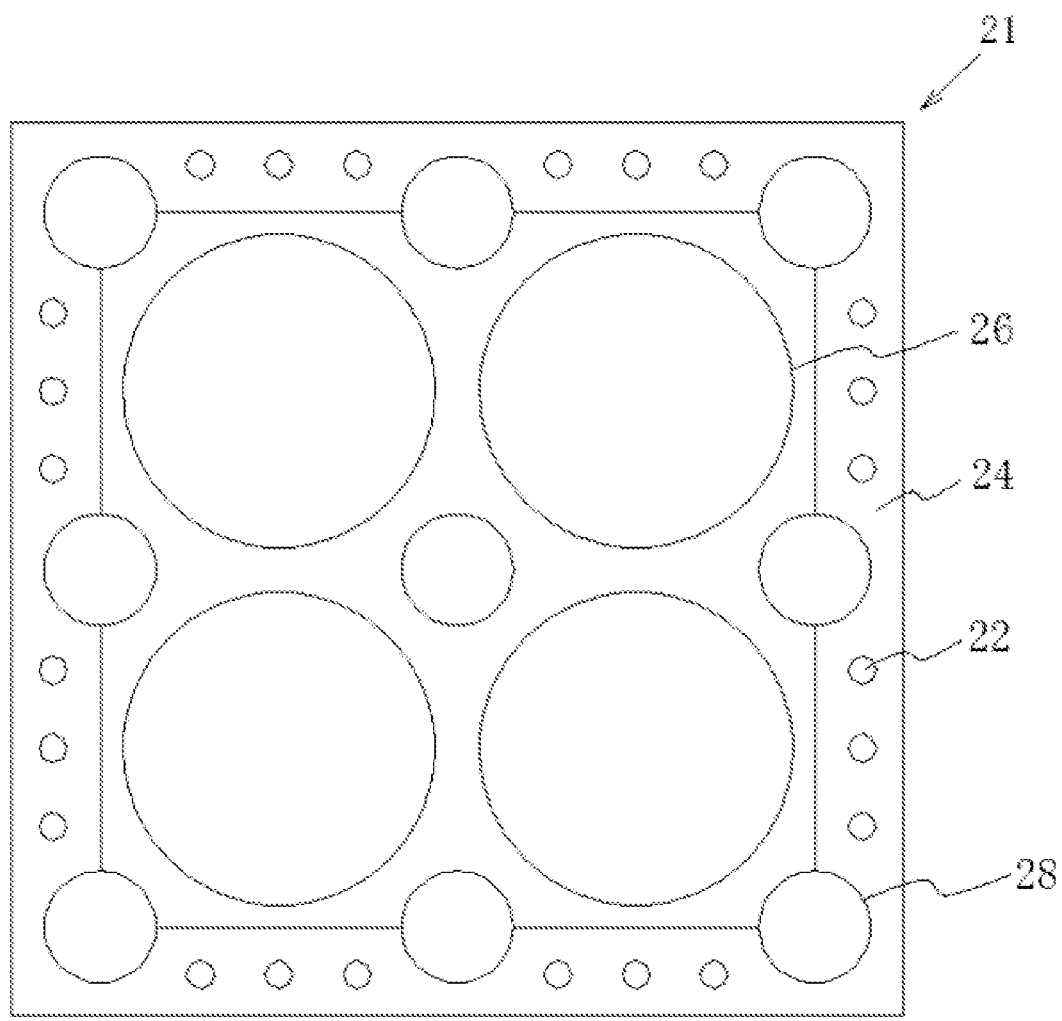
FIG. 3 is a top view schematically illustrating a third embodiment example of an antenna substrate of the present disclosure.

In the one example of the above-described embodiments, only the first opening portion 26 is disposed in the second insulating layer 21; however, as illustrated in FIG. 3, a second opening portion 28 may be disposed, in the second insulating layer 21, between the respective first opening portions 26; and between the first opening portion 26 and an outer periphery of the second insulating layer 21. Furthermore, the second opening portion 28 may be solely disposed between the respective first opening portions 26 or may be solely disposed between the first opening portion 26 and the outer periphery of the second insulating layer 21. The second opening portion 28 is disposed such that the second opening portion 28 does not communicate with the communicating portion 27. The size of the second opening portion 28 may be equal to or greater than the size of the first opening portion. The second opening portion 28 may be of a polygonal shape, an oval shape, or an elliptical shape, as well as the circular shape. The second opening portion 28 may be an opening portion, formed in a circular shape, a polygonal shape, an oval shape, and an elliptical shape, with a cutout portion or the like. The second opening portion 28 has a function of further reducing the deformation of the antenna substrate A by the balanced rigidity of the second insulating layer 21.

For example, in the one example of the above-described embodiments, an example, in which the first opening portion 26 has a circular shape that is easily processed by a hole-forming process such as the drilling process, is given. However, the first opening portion 26 may have a shape similar to that of the first antenna conductor 12. This may further reduce the number of portions where the spacing between the respective adjacent first opening portions 26. This enables the rigidity of the second insulating layer 21 to be enhanced, further reducing the deformation of the antenna substrate A.

REFERENCE SIGNS LIST

10 Cap substrate
11 First insulating layer
12 First antenna conductor
13 First connection pad
20 Frame substrate
21 Second insulating layer
22 Second connection pad
23 Third connection pad
26 First opening portion
30 Base substrate
31 Third insulating layer
32 Second antenna conductor
34 Fourth connection pad
A Antenna substrate

The invention claimed is:

1. An antenna substrate comprising:
a cap substrate comprising a first insulating layer, a plurality of first antenna conductors arranged lengthwise and crosswise on both an upper surface and a lower surface of the first insulating layer and aligned to face each other with the first insulating layer interposed in between, and a first connection pad disposed on an outer peripheral edge of the lower surface of the first insulating layer;
a frame substrate comprising a second insulating layer, a second connection pad disposed on an outer peripheral edge of an upper surface of the second insulating layer, and a third connection pad disposed on an outer peripheral edge of a lower surface of the second insulating layer; and
a base substrate comprising a third insulating layer, a plurality of second antenna conductors arranged on an upper surface of the third insulating layer, and a fourth connection pad disposed on an outer peripheral edge of an upper surface of the third insulating layer, wherein the first connection pad and the second connection pad are connected to each other, the third connection pad and the fourth connection pad are connected to each other, and the base substrate, the frame substrate, and the cap substrate are layered in this order, the second insulating layer comprises a plurality of first opening portions each having an outer periphery located radially outward from an outer periphery of the first antenna conductor in a top view, and the first opening portion is disposed to encircle the outer periphery of the first antenna conductor.

2. The antenna substrate according to claim 1, further comprising:

a communicating portion that allows the respective first opening portions to communicate with each other.

3. The antenna substrate according to claim 1, wherein the first opening portion has a circular shape.

4. The antenna substrate according to claim 1, wherein the second insulating layer comprises a second opening portion at least one of positions between the respective first opening portions; and between the first opening portion and an outer periphery of the second insulating layer.

5. The antenna substrate according to claim 4, wherein the second opening portion has a circular shape.

6. The antenna substrate according to claim 1, wherein the first antenna conductor included among the plurality of first antenna conductors on the upper surface of the first insulating layer and the first antenna conductor included among the plurality of first antenna conductors on the lower surface of the first insulating layer, which mutually face each other with the first insulating layer interposed in between, have an identical shape and dimensions.

7. The antenna substrate according to claim 1, wherein the first opening portion forms a cavity when clamped between the cap substrate and the base substrate.

8. The antenna substrate according to claim 1, wherein the first opening portion is disposed to individually encircle the outer periphery of the first antenna conductor.

* * * * *